(12) United States Patent
Munekane et al.

(10) Patent No.: US 7,923,267 B2
(45) Date of Patent: Apr. 12, 2011

(54) METHOD OF MEASURING LENGTH OF MEASUREMENT OBJECT ARTICLE IN MICRO-STRUCTURE

(75) Inventors: Masanao Munekane, Chiba (JP); Junichi Tashiro, Chiba (JP)

(73) Assignee: SII Nanotechnology Inc. (JP)

( * ) Notice: Subject to any disclaimer, the term of this patent is extended or adjusted under 35 U.S.C. 154(b) by 1318 days.

(21) Appl. No.: 11/346,826

(22) Filed: Feb. 3, 2006

(65) Prior Publication Data
US 2006/0216838 A1    Sep. 28, 2006

(30) Foreign Application Priority Data

Feb. 10, 2005  (JP) .................................. 2005-034730

(51) Int. Cl.
*G01R 31/26* (2006.01)
(52) U.S. Cl. ........................................ 438/16; 356/237.4
(58) Field of Classification Search ................... 438/14, 438/16; 356/237.4, 237.5
See application file for complete search history.

(56) References Cited

U.S. PATENT DOCUMENTS

| 5,156,982 | A | * | 10/1992 | Nagoya ............................ 438/14 |
| 5,721,721 | A | * | 2/1998 | Yanagisawa et al. ......... 369/126 |
| 5,857,258 | A | * | 1/1999 | Penzes et al. ................... 29/846 |
| 6,653,214 | B1 | * | 11/2003 | Quach et al. ................... 438/597 |
| 7,595,482 | B2 | * | 9/2009 | Nakayama ................. 250/252.1 |
| 2002/0082789 | A1 | * | 6/2002 | Takizawa et al. ............... 702/85 |

OTHER PUBLICATIONS

Patent Abstracts of Japan, publication No. 60-113940, publication date Jun. 20, 1985.

* cited by examiner

*Primary Examiner* — David Vu
*Assistant Examiner* — Shaun Campbell
(74) *Attorney, Agent, or Firm* — Adams & Wilks

(57) ABSTRACT

A substrate comprises a substrate main body having a surface on which a measurement object article is to be formed. A reference scale is disposed on the surface of the substrate main body in the vicinity of a region of the surface where the measurement object article is to be formed. The reference scale has adjacent graduations spaced-apart a preselected distance from one another.

14 Claims, 5 Drawing Sheets

MICRON BAR

MICRON BAR

METHOD OF MEASURING LENGTH OF MEASUREMENT OBJECT ARTICLE IN MICRO-STRUCTURE

BACKGROUND OF THE INVENTION

The present invention relates, in a process of manufacturing a semiconductor device or the like, to a substrate and a micro-structure, which have a reference scale utilized in a length measurement of a wiring pattern or the like, a method of making the reference scale, and a method of measuring a length of a wiring pattern in the micro-structure.

In recent years, a due to progress in micromachining techniques, micro-structures such as integrated circuits and semiconductor devices have been increasingly micronized, and wiring patterns or the like are provided with a spacing of only several μm, for instance. Since this dimension becomes a factor determining a basic performance of the micro-structure, such as frequency characteristic, of an electronic circuit, there is a demand for accurate measurement of a length of the micro-structure.

As a length measuring method, although various methods are provided, there is known a method of length-measuring from a beam scanning distance or a secondary electron image, in which a signal change (contrast change place) when scanning has been made a reference by a beam system of a scanning electron microscope (SEM) or the like. This length measuring method utilizing the SEM is adapted such that a micron bar becoming the reference of the length is displayed generally on a monitor confirming an FIB image of a length measuring object article. By comparing this micro bar with the length measuring object article, there have been measured the length of the length measuring object article, a spacing between the length measuring object articles adjoining each other, and the like (for example, refer to JP-A-2001-357812 Gazette).

Incidentally, in an observation by an optical microscope, there is adopted a method utilizing a scale having been displayed in a lens, not the micro bar. Further, in an observation field, in compliance with a measurement object article, there is required the micro bar of an optimum size in a range of nm-mm.

However, in the above conventional method, the following problems have been identified.

That is, since the micron bar is one displayed two-dimensionally on an image plane, it is possible to accurately length-measure the measurement object article by utilizing the micro bar in a case where an FIB is irradiated perpendicularly to the measurement object article, but it has been impossible to perform an accurate length measurement in a case where the measurement object article is slanted. In other words, since it follows that the length measuring object article slanting with respect to an irradiating direction of the FIB is length-measured, it is impossible to simply compare the length measuring object article with the micron bar, so that it has been impossible to perform the length measurement with the micro bar being made the reference.

Further, in a case where the optical microscope has been utilized, since even the micro bar does not exist, the length measurement has been difficult to obtain.

The present invention is one made in view of such circumstances, and its object is to provide a substrate and a micro structure, in which the length measurement can be accurately and easily performed irrespective of a posture of the length measuring object article, a method of making the reference scale, and a method of measuring the length of the micro structure.

SUMMARY OF THE INVENTION

In order to solve the above problems, the present invention provides the techniques mentioned below.

A substrate of the present invention comprises a substrate main body having a surface on which there is formed a measurement object article, and a reference scale provided on the surface of the substrate main body, in the vicinity of a region where the measurement object article is formed so as to extend in at least one direction, wherein the reference scale has plural graduations which have been formed by utilizing a focused ion beam and adjacently disposed for every spacing having been previously determined.

A method of making a reference scale of the present invention is one which makes the reference scale in the vicinity of a region, where a measurement object article is formed, on a surface of a substrate main body in whose surface there is formed the measurement object article, characterized by possessing a working process which performs a working while relatively moving the substrate main body and an irradiation axis of a focused ion beam in a direction parallel to the surface of the substrate main body and scanning toward at least one direction such that plural graduations are adjacently disposed for every spacing having been previously determined.

In the substrate and the method of making the reference scale, which are concerned with this invention, by performing the working process utilizing the focused ion beam (FIB), it is possible to form, on the substrate main body, the reference scale in the vicinity of the region where the measurement object article is formed so as to extend in at least one direction. That is, first, an irradiation of the FIB is performed onto the surface of the substrate main body. And, the working process of forming the reference scale is performed by relatively moving the substrate main body and the irradiation axis of the FIB toward an XY direction parallel to the surface of the substrate main body, and by, e.g., etching-working a substrate surface. On this occasion, the working is performed such that, toward at least one direction, the plural graduations are adjacently disposed for every spacing (e.g., 5 μm) having been previously determined.

By the foregoing construction, the reference scale, which becomes an indicator when performing the length measurement, is formed in the vicinity of the region where the measurement object article is formed as mentioned above. Therefore, after the measurement object article, e.g., wiring pattern or the like, has been formed on the substrate main body, even if the substrate main body has been slanted, since the reference scale is formed directly in the surface of the substrate main body, it is possible to accurately perform the length measurement by directly comparing the graduation of the reference scale with the measurement object article.

Especially, since the reference scale is formed in the vicinity of the measurement object article, it is possible to rapidly perform the comparison and further, since it is possible to perform the length measurement even from whichever direction irrespective of the posture (slanting state) of the substrate main body, the length measurement is easy to obtain and easy to use. Further, since the reference scale is formed by utilizing the FIB, the graduation can be formed within an arbitrary range of nm-mm without selecting a raw material of the substrate main body, so that a degree of freedom in the design is high.

Further, since the reference scale is formed directly in the substrate main body, even if an observation has been performed by, e.g., an optical microscope not by an SEM observation in which the micron bar is displayed on the image plane, it is possible to easily and accurately perform the length measurement, thereby achieving the measurement process with greater convenience.

Further, a method of making a reference scale of the present invention is one wherein, in a method of making a reference scale according to the above present invention, the working is performed by irradiating the focused ion beam to the surface of the substrate main body under a state that a focused ion beam lens-barrel has been positioned perpendicularly to the surface.

In the method of drawing the reference scale concerned with this invention, since the graduation of the reference scale is formed by irradiating the FIB to the surface of the substrate main body under the state that the focused ion beam lens-barrel has been positioned perpendicularly to the surface, it is possible to more accurately form the graduation for every predetermined spacing. Therefore, it is possible to intend to increase an accuracy of the length measurement.

Further, a method of making a reference scale of the present invention is one wherein, in a method of making a reference scale of the above present invention, on the occasion of the working process, a correction value is calculated by multiplying the spacing by a coefficient having complied with an angle formed by the surface of the substrate main body and an irradiation direction of a focused ion beam lens-barrel, and the correction value having been calculated is used as a value of the spacing.

In the method of making the reference scale concerned with this invention, it is possible to form the graduation of the reference scale by irradiating the FIB to the surface of the substrate main body from an arbitrary angle. That is, the correction value is calculated by multiplying the spacing with which it is intended to form the graduation by the coefficient having complied with the angle (e.g., 45 degrees) formed by the surface of the substrate main body and the irradiation direction of the focused ion beam lens-barrel, and the calculated value concerned is used as the value of the spacing.

By this, even if the FIB has been irradiated from the slanting angle of 45 degrees, it is possible to form one similar to one in which the graduation has been formed by irradiating the FIB from the direction perpendicular to the surface of the substrate main body (it is possible to obtain a similar effect). Therefore, similarly to the case where it has been irradiated from the perpendicular direction, it is possible to accurately form the graduation for every predetermined spacing. Since the irradiation direction of the FIB can be freely set like this, it is possible to improve the degree of freedom in the design.

Further, a substrate of the present invention is one wherein, in a substrate of the above present invention, the reference scale is one having been formed by etching-working the surface of the substrate main body.

Further, a method of making a reference scale of the present invention is one wherein, in a method of making a reference scale according to any of the above present inventions, on the occasion of the working process, the graduation is formed by etching-working the surface of the substrate main body by the focused ion beam.

In the substrate and the method of making the reference scale, which are concerned with this invention, since the reference scale is formed by etching-working the surface of the substrate main body, there is no defect that it is exfoliated and taken off, so that it is possible to certainly display the graduation even if used for a long time and it is possible to improve a reliability as the indicator.

Further, a substrate of the present invention is one wherein, in a substrate of the above present invention, the reference scale is one having been formed by depositing a deposition film onto the surface of the substrate main body.

Further, a method of making a reference scale of the present invention is one wherein, in a method of making a reference scale according to any of the above present inventions, on the occasion of the working process, a deposition film is deposited to the surface of the substrate main body by supplying, together with an irradiation of the focused ion beam, a raw material gas forming the deposition film, thereby forming the graduation.

In the substrate and the method of drawing the reference scale, which are concerned with this invention, since the reference scale is formed by the deposition film having been deposited to the surface of the substrate main body, even if the substrate main body has been optically transparent, it is possible to clearly display the reference scale. Therefore, it is possible to intend an improvement in a visibility.

Further, a substrate of the present invention is one wherein, in a substrate of the above present invention, the reference scale is one having been formed by etching-working a deposition film having been deposited onto the surface of the substrate main body.

Further, a method of making a reference scale of the present invention is one wherein, in a method of making a reference scale according to any of the above present inventions, the working process has a deposition process of depositing a deposition film to the whole of a region, where the graduation is formed, by supplying, together with an irradiation of the focused ion beam, a raw material gas forming the deposition film, and an etching process of etching-working, together with stopping the supply of the raw material gas after the deposition process, the deposition film having been deposited by the focused ion beam, thereby forming the graduation.

In the substrate and the method of making the reference scale, which are concerned with this invention, since the reference scale is formed by etching-working the deposition film by the working process and the etching process, surroundings of the graduation becomes a state having been fringed with the deposition film. Therefor, it is possible to further improve a visibility.

Further, a micro structure of the present invention is one characterized by having been manufactured by a substrate according to any of the above present inventions.

In the micro structure concerned with this invention, since it is manufactured from the substrate having the reference scale in the vicinity of the region where there is formed the measurement object article such as wiring pattern, it is possible to easily and accurately length-measure the measurement object article irrespective of the posture of the substrate main body, so that it is possible to grasp a spacing, a length and the like of the wiring pattern and the like. Therefore, it is possible to intend to increase a quality of product.

Further, a method of measuring a length of a microstructure of the present invention is a method of measuring a length of a micro structure, which measures the length of the micro structure in which there has been formed a measurement object article in a substrate having a substrate main body in whose surface there is formed the measurement object article, and a reference scale having plural graduations which, on the surface of the substrate main body, have been formed by utilizing a focused ion beam in the vicinity of a region, where the measurement object article is formed, so as to extend in at least one direction, and which have been adjacently disposed for every spacing having been previously determined, wherein a length measurement of the measurement object article is performed by comparing the plural graduations with the measurement object article, thereby making the graduation a reference.

In the method of measuring the length of the microstructure, which is concerned with this invention, since the length measurement is performed by comparing the measurement object article with the reference scale formed in the vicinity of the measurement object article on the substrate main body and becoming the indicator when performing the length measurement, even if the substrate main body has been slanted, it is possible to accurately perform the length measurement of the measurement object article with the graduation being made the reference. Especially, since there is performed the comparison with the reference scale having been formed in the vicinity of the measurement object article, it is possible to rapidly perform the comparison concerned and further, since the length measurement can be performed even from whichever direction irrespective of the posture (slanting state) of the substrate main body, the length measurement is easy and easy to use.

Further, since the reference scale is formed directly in the substrate main body, even if the observation has been performed by, e.g., the optical microscope not by the SEM observation in which the micron bar is displayed on the image plane, it is possible to easily and accurately perform the length measurement, and it is easy to use.

According to the substrate and the method of making the reference scale, which are concerned with the present invention, even if the substrate main body has been slanted, it is possible to accurately perform the length measurement by comparing the graduation of the reference scale with the measurement object article. Especially, since it is possible to rapidly perform the comparison and it is possible to perform the length measurement even from whichever direction irrespective of the posture (slanting state) of the substrate main body, the length measurement is easy and easy to use. Further, since the reference scale is formed directly in the substrate main body, even if the observation has been performed by, e.g., the optical microscope, it is possible to easily and accurately perform the length measurement, so that it is possible to intend to improve the convenience.

Further, according to the micro structure concerned with the present invention, it is possible to easily and accurately length-measure the measurement object article irrespective of the posture of the substrate main body, so that it is possible to grasp the spacing, the length and the like of the wiring pattern and the like. Therefore, it is possible to intend to increase the quality of product.

Further, according to the method of measuring the length of the micro structure, which is concerned with the present invention, even if the substrate main body has been slanted, it is possible to accurately perform the length measurement of the measurement object article with the scale being made the reference. Especially, since it is possible to rapidly perform the comparison and the length measurement can be performed even from whichever direction irrespective of the posture (slanting state) of the substrate main body, the length measurement is easy to obtain and easy to use. Further, even if the observation has been performed by the optical microscope, it is possible to easily and accurately perform the length measurement, so that it is easy to use.

BRIEF DESCRIPTION OF THE DRAWINGS

FIGS. 6A and 6B is views showing a state that the length measurement is being performed by irradiating the FIB to the micro structure shown in FIG. 1 from a direction perpendicular to the same, wherein FIG. 6A shows an image having been displayed to a display section, and FIG. 6B shows a relation between the incident angle of the FIB and the micro structure.

FIGS. 7A and 7B are views showing a state that the length measurement is being performed by irradiating the FIB to the micro structure shown in FIG. 1 from a slanting direction, wherein FIG. 7A shows the image having been displayed to the display section, and FIG. 7B shows the relation between the incident angle of the FIB and the micro structure.

DETAILED DESCRIPTION OF THE INVENTION

Hereunder, by referring to FIG. 1 to FIGS. 7A-7B, there is explained one embodiment of each of a substrate, a microstructure (hereinafter "micro structure"), a method of making a reference scale, and a method of measuring a length of the micro-structure, which are concerned with the present invention.

Figure 1:
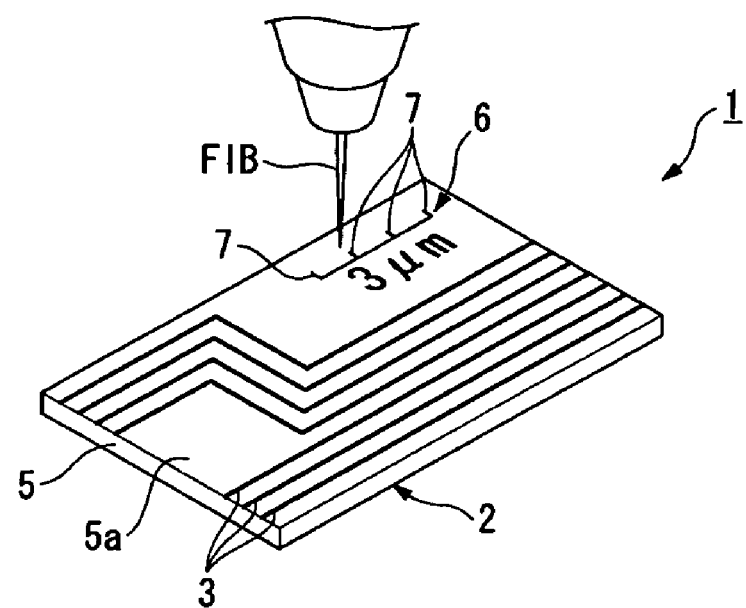
FIG. 1 is a perspective view showing one embodiment of a micro structure concerned with the present invention.
Figure 2:
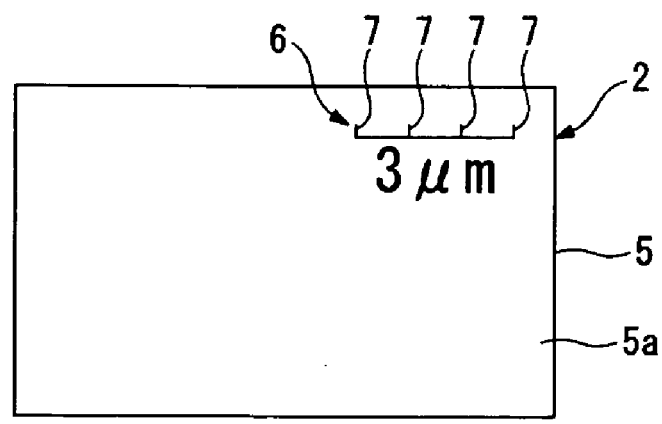
FIG. 2 is a top view of a substrate concerned with the present invention, which is used when manufacturing the micro structure shown in FIG. 1.

As shown in FIG. 1, an IC substrate (micro structure) 1 of the present embodiment is manufactured by a substrate 2 shown in FIG. 2, and constituted by the substrate 2 and a wiring pattern (measurement object article) 3 having been formed in the substrate 2.

As shown in FIG. 2, this substrate 2 possesses a substrate main body 5 in whose surface 5a there is formed the wiring pattern 3, and a reference scale 6 having been provided, on a surface 5a of the substrate main body 5, in the vicinity of a region where the wiring pattern 3 is formed so as to extend at least in one direction.

Figure 3:
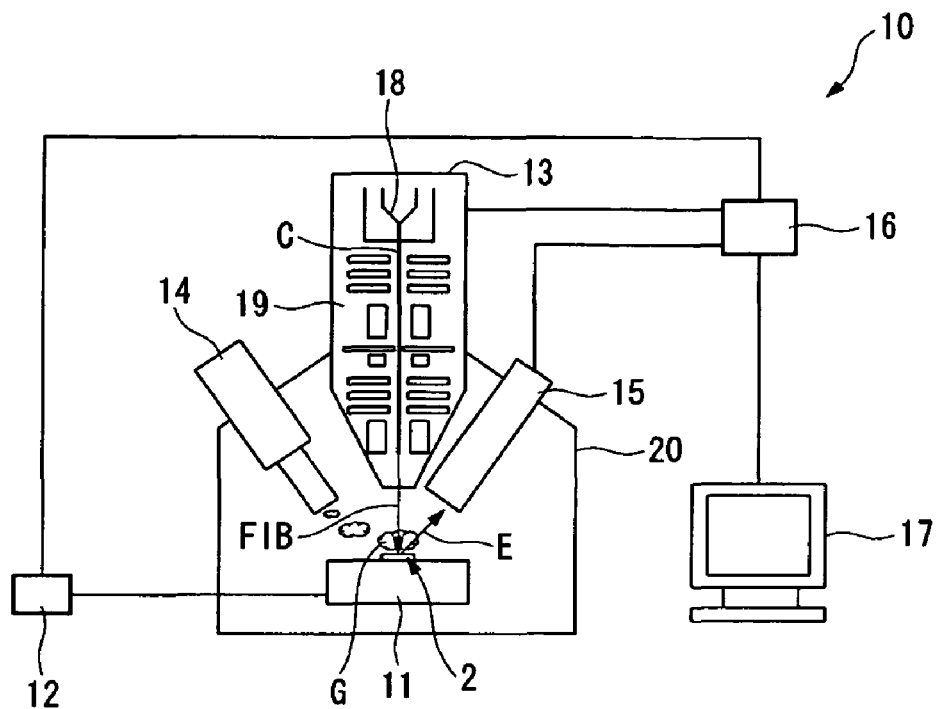
FIG. 3 is a constitutional view of a focused ion beam apparatus used when making the substrate shown in FIG. 2.

This reference scale 6 is formed by utilizing a focused ion beam (FIB) irradiated from a focused ion beam apparatus 10 shown in FIG. 3, and has three (plural) graduations 7 having been adjacently disposed in a predetermined spacing, e.g., every 1 μm. That is, the reference scale 6 has a length of 3 μm.

Incidentally, in the present embodiment, the reference scale 6 is one having been formed by depositing a deposition film onto the surface 5a of the substrate main body 5.

Here, there is explained about the above focused ion beam apparatus 10. As shown in FIG. 3, this focused ion beam apparatus 10 possesses a sample stage 11 mounting the substrate main body 5, a sample stage control mechanism 12 capable of moving the sample stage 11 in an XY direction parallel to the surface 5a of the substrate main body 5, an ion irradiation section 13 (e.g., focused ion beam lens-barrel) irradiating the FIB toward the surface 5a of the substrate main body 5, a gas gun 14 supplying a raw material gas (e.g., phenantherene etc.) G forming the deposition film in the vicinity of the surface 5a of the substrate main body 5, to which the FIB is irradiated, a secondary electron detector 15 detecting secondary electrons E having been generated by the irradiation of the FIB, and a display section 17 in which the secondary electrons E having been detected by the secondary electron detector 15 are converted into a luminance signal and displayed as a secondary electron image through a control mechanism 16.

Further, the above ion irradiation section 13 has an ion generation source 18 and an ion optical system 19, and is adapted such that ions C having been generated by the ion generation source 18 are made the FIB by being finely converged by the ion optical system 19, and irradiated toward the substrate main body 5. Further, the sample stage 11 is made so as to be movable in a Z direction perpendicular to the XY direction, rotatable about a Z axis, inclinable at an arbitrary angle, and so forth.

Further, the control mechanism 16 is adapted so as to perform a synthetic control of each of the above constituent articles. Further, the above substrate 2 is accommodated in a container 20 whose internal pressure is adjustable, and adapted such that the FIB irradiation, a supply of the raw material gas G, and the like are provided in the container 20.

Next, there is explained about a case where, by the focused ion beam apparatus 10 having been constituted like this, the reference scale 6 is formed in the substrate main body 5 to thereby manufacture the substrate 2.

A method of making the reference scale 6 of the present embodiment possesses an irradiation process irradiating the FIB toward a vicinity of a region where the wiring pattern 3 is formed, and a working process in which the substrate main body 5 and an irradiation axis of the FIB are relatively moved in the XY direction parallel to the surface 5a of the substrate main body 5 to thereby perform a working toward at least one direction while scanning it such that the plural graduations 7 are adjacently disposed for every predetermined spacing (1 μm).

Each of the foregoing processes are explained in detail below. Incidentally, in the present embodiment, during the working process, a focused ion beam lens-barrel, i.e., the ion irradiation section 13, is positioned perpendicularly to the surface 5a of the substrate main body 5, and the FIB is irradiated perpendicularly to the surface 5a of the substrate main body 5.

Figure 4:
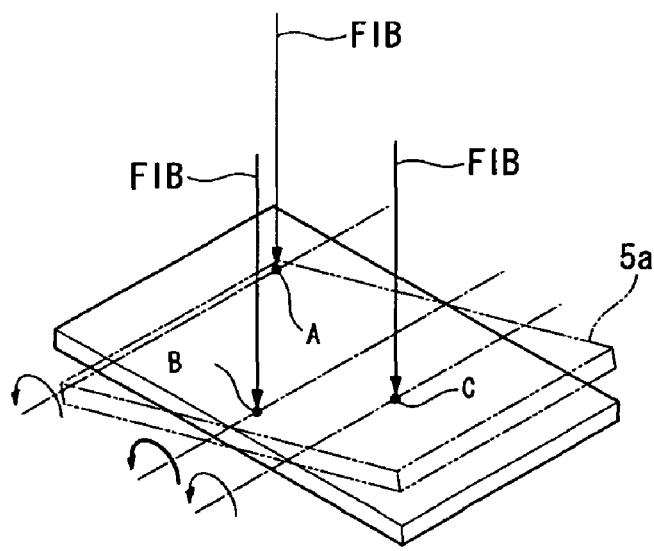
FIG. 4 is a perspective view showing a state that a slanting state is being adjusted such that a region where a reference scale is formed is being adjusted so as to become a plane with respect to an incident angle of an FIB.
Figure 5:
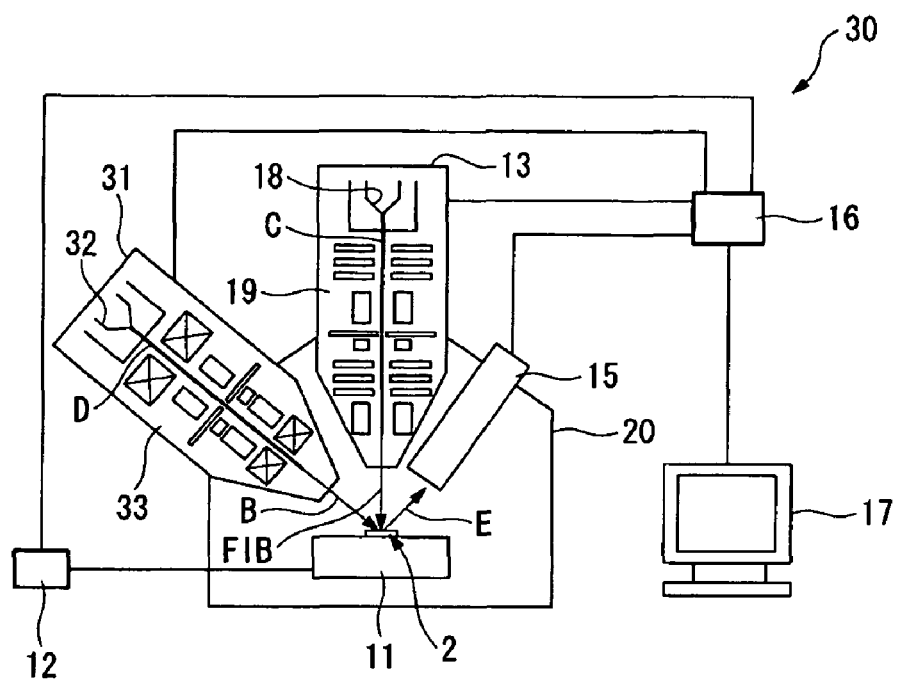
FIG. 5 is a constitutional view of a focused ion beam sample making apparatus used when performing a length measurement of the micro structure shown in FIG. 1.

First, after the substrate main body 5 has been set to the sample stage 11, there is determined a region (range of several μm) where it is desired to form the reference scale 6, and there is performed an initial setting in which a slant of the sample stage 11 is finely adjusted such that the region concerned becomes a plane perpendicular to an incident angle of the FIB. That is, as shown in FIG. 4, on the surface 5a of the substrate main body 5, heights of three points in total of, e.g., two points (A point, B point) in both sides of the region where it is desired to form the reference scale 6 and a center (C point) of the region are finely adjusted so as to become a constant height from the sample stage 11.

Concretely, when the substrate main body 5 has been slanted in each of the positions (A point, B point, C point) to which the FIB is irradiated, the height adjustment is performed such that respective rotation center positions coincide. By this process, a plane of the whole of the region where it is desired to form the reference scale 6 becomes the plane perpendicular to the incident angle of the FIB.

Incidentally, when performing the height adjustment (slant adjustment), although a height measurement in the three points has been performed, it is not limited to the three points in a case where the reference scale 6 is provided in a direction having extended in an inter-two-pint direction, and it suffices if the height measurement is performed in at least the two points.

After the above initial setting, there is performed the above irradiation process irradiating the FIB toward the above region from the ion irradiation section 13. Subsequently, there is performed the above working process forming the reference scale 6 by moving the sample stage 11 in the XY direction by the sample stage control mechanism 12, i.e., by relatively moving the substrate main body 5 and the irradiation axis of the FIB toward the XY direction. Concretely, together with the irradiation of the FIB there is performed the supply of the raw material gas G by the gas gun 14 and, under this state, there is performed a scan. By this, the deposition film is deposited in the vicinity of the region where the wiring pattern 3 is formed, which is on the surface 5a of the substrate main body 5, and it is possible to manufacture the substrate 2 in which there has been performed the reference scale 6 becoming the indicator when performing the length measurement.

Incidentally, on the occasion of the working process, a working situation of the reference scale 6 is displayed to the display section 17 by detecting the secondary electrons E, which have been generated by the irradiation of the FIB, by the secondary electron detector 15.

As mentioned above, in the substrate 2 and the method of making the reference scale 6 of the present embodiment, since the reference scale 6 is formed directly in the surface 5a of the substrate main body 5, even if the substrate main body 5 has been slanted when performing the length measurement, it is possible to accurately perform the length measurement by directly comparing the graduation 7 of the reference scale 6 with the wiring pattern 3.

Especially, since the reference scale 6 is formed in the vicinity of the wiring pattern 3, it is possible to rapidly perform the comparison and further, since it is possible to perform the length measurement even from whichever direction irrespective of the posture (slanting state) of the substrate main body 5, the length measurement is easy and easy to use. Further, since the reference scale 6 is formed by utilizing the FIB, the graduation 7 can be formed within the arbitrary range of nm-mm without selecting the raw material of the substrate main body 5, so that the degree of freedom in the design is high.

Further, in the present embodiment, since the graduation 7 of the reference scale 6 is formed under the state that the FIB has been irradiated perpendicularly to the surface 5a of the substrate main body 5, it is possible to more accurately form the graduation 7 in a predetermined spacing, i.e., for every 1 μm. Therefore, it is possible to intend to increase the manufacturing accuracy.

Furthermore, by forming the predetermined wiring pattern 3 in the substrate 2, it is possible to manufacture the IC substrate 1 shown in FIG. 1.

As mentioned above, since the IC substrate 1 is manufactured from the substrate 2 having the reference scale 6 in the vicinity of the region where the wiring pattern 3 is formed, it is possible to easily and accurately measure a length of the wiring pattern 3 irrespective of the posture (slanting state), and it is possible to grasp the spacing and the length of the wiring pattern 3, and the like. Therefore, the quality of the product is increased.

Here, there is more concretely explained about a length measuring method of a micro structure, which length-measures the IC substrate 1. In the present embodiment, as one of the length measuring methods, there is explained an example in which the length measurement is performed by using a focused ion beam sample making apparatus 30 shown in FIG. 5.

This focused ion beam sample making apparatus 30 possesses an electron beam irradiation section 31 irradiating an electron beam B toward the surface 5a of the substrate main body 5 in addition to the sample stage 11, the sample stage control mechanism 12, the ion irradiation section 13, the secondary electron detector 15, the control mechanism 16, the display section 17 and the container 20 among the constituent articles of the above focused ion beam apparatus 10. Further, this electron beam irradiation section 31 has an ion generation source 32 and an electron optical system 33, and is adapted such that electrons D having been generated by the electron generation source 32 can be irradiated as the electron beam B by being finely converged by the electron optical system 33.

Incidentally, similarly to the FIB irradiation time, there is adapted such that the secondary electrons E having been generated by the irradiation of the electron beam B are detected by the secondary electron detector 15, and the secondary electron image can be displayed to the display section 17.

The length measuring method of the micro structure of the present embodiment having utilized this focused ion beam sample making apparatus 30 is one in which the graduation 7 of the reference scale 6 having been formed on the surface 5a of the substrate main body 5 is compared with the wiring pattern 3 which is desired to be measured, thereby performing the length measurement of the wiring pattern 3 by making the graduation 7 the reference.

First, after the IC substrate 1 has been mounted to the sample stage 11, the sample stage 11 is scanned in the XY direction by the sample stage control mechanism 12 while irradiating the FIB or the electron beam B toward the IC substrate 1 from the ion irradiation section 13 or the electron beam irradiation section 31. On this occasion, the secondary electrons E having been generated by the irradiation of the FIB or the electron beam B are detected by the secondary electron detector 15, and the secondary electron image is displayed to the display section 17.

Figure 6A:
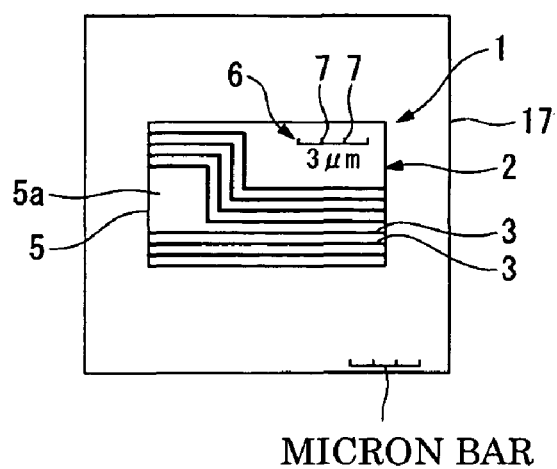
Figure 6B:
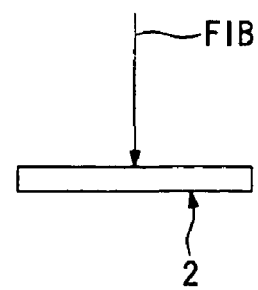

As shown in FIGS. 6A and 6B, by this, it is possible to display the reference scale 6 and the wiring pattern 3 onto the image plane of the display section 17 under a state that the IC substrate 1 has been seen from just above. Incidentally, on the image plane, there is displayed a conventional micron bar as well.

Furthermore, by comparing the wiring pattern 3 and graduation 7 of the reference scale 6, which have been displayed on the display, it is possible to perform the length measurement of the wiring pattern 3. Incidentally, under a state shown in FIG. 6A, it is also possible to perform the length measurement by comparing the conventional micron bar with the wiring pattern 3.

Figure 7A:
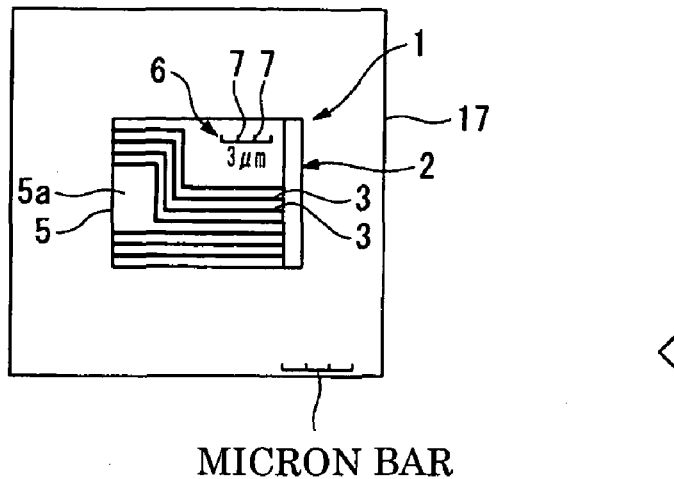
Figure 7B:
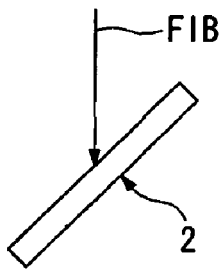

However, in a case where the conventional micron bar has been utilized, when the IC substrate 1 has been slanted by a slant of the sample stage 11 as shown in FIGS. 7A and 7B, since the micron bar does not follow an angle of the slant concerned, it is impossible to perform the length measurement by simply comparing with the micron bar.

In contrast to this, since the reference scale 6 of the present invention is formed on the substrate main body 5, even if the IC substrate 1 has been slanted, it is possible to accurately perform the length measurement of the wiring pattern 3 with the graduation 7 being made the reference. In this manner, since the length measurement can be performed even from whichever direction irrespective of the slanting state of the IC substrate 1, the length measurement is easy to obtain.

Further, since the reference scale 6 is formed by the deposition film, the visibility is good and the length measurement of a high accuracy can be performed.

Further, in the present embodiment, it is possible to perform the length measurement from the reference scale 6 having been made by the FIB by utilizing an SEM image without slanting an SEM stage perpendicularly to the irradiation direction of the electron beam B.

Incidentally, a technical scope of the present invention is not one limited to the above embodiment, and it is possible to add various modifications in a scope not deviating from a gist of the present invention.

Figure 8:
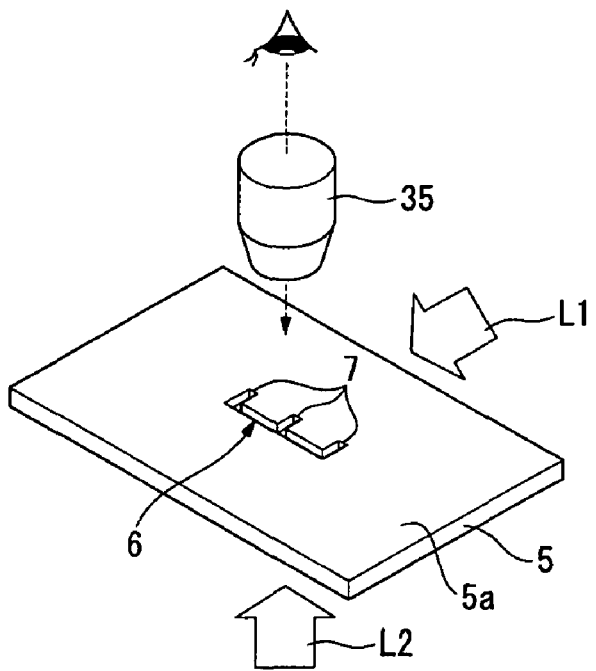
FIG. 8 is a perspective view showing a state that the substrate having been formed by an etching working is being observed by an optical microscope.

For example, in the above embodiment, although the reference scale 6 has been formed by depositing the deposition film, such is not limited to this, and the graduation 7 may be formed, as shown in FIG. 8, by etching-working the surface 5a of the substrate main body 5 by the FIB on the occasion of the working process. In this case, since the reference scale 6 is being etched, there is not such a defect that it is exfoliated and taken off, so that it is possible to certainly display the graduation 7 even if used for a long time. Therefore, it is possible to improve the reliability of the reference scale.

Incidentally, as shown in FIG. 8, the length measurement by an optical microscope 35 may be performed, not the length measurement having utilized the FIB. In this case, an upper part illumination light L1 may be utilized, or a lower part transmission type illumination light L2 may be utilized.

Figure 9:
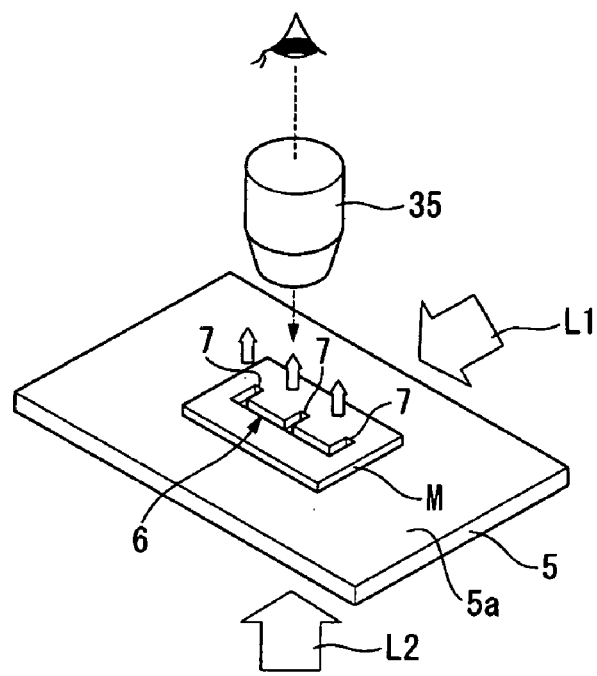
FIG. 9 is a perspective view showing a state that the substrate having been formed by etching-working a deposition film is being observed by the optical microscope.

Further, the reference scale 6 may be formed, as shown in FIG. 9 for instance, by etching-working a deposition film M having been deposited on the surface 5a of the substrate main body 5 without being limited only to the etching working having been mentioned above. That is, it suffices if, on the occasion of the working process, there are performed a deposition process depositing the deposition film M to the whole of a region where the graduation 7 is formed by supplying the raw material gas G together with the irradiation of the FIB, and an etching process forming, after the deposition process, the graduation 7 by stopping the supply of the raw material gas G and etching-working the deposition film M having been deposited by the FIB.

Since the reference scale 6 having been formed like this becomes a state that surroundings of the graduation 7 have been fringed with the deposition film M, it is possible to more improve the visibility. Especially, in a case where as the substrate main body 5 there is adopted the substrate 2 which is optically transparent, it becomes easier to confirm the reference scale 6 by using a transmitted light by the lower part transmission type illumination light L2, not a downward illumination.

Further, in the above embodiment, although the reference scale 6 has been formed by irradiating the FIB perpendicularly to the surface 5a of the substrate main body 5, the reference scale 6 may be formed by irradiating the FIB from an arbitrary direction without being limited to a perpendicular direction.

In this case, it suffices if, on the occasion of the working process, a correction value is calculated by multiplying a desired spacing, with which it is intended to form the graduation 7, by a coefficient having complied with an angle formed by the surface 5a of the substrate main body 5 and the focused ion beam lens-barrel (the ion irradiation section 13), and the correction value having been calculated is used as a new spacing value.

By this, even if the FIB has been irradiated from an angle of 45 degrees slanting with respect to the surface 5a of the substrate main body 5, it is possible to form one similar to one in which the graduation 7 has been formed by irradiating the FIB from the direction perpendicular to the surface 5a of the substrate main body 5. Therefore, similarly to the case where it has been irradiated from the perpendicular direction, it is possible to accurately form the graduation 7 for every predetermined spacing. Since the irradiation direction of the FIB can be freely set like this, it is possible to improve the degree of freedom in the design.

Figure 10:
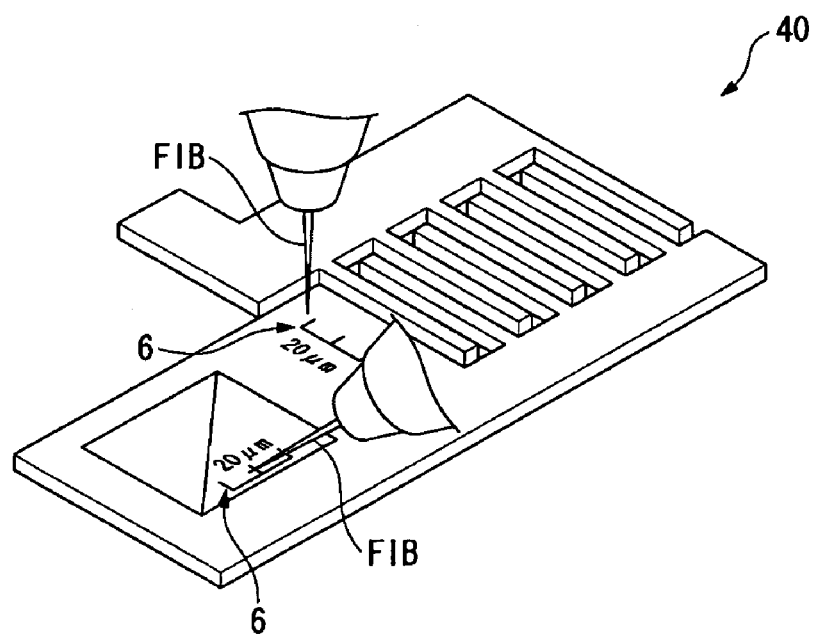
FIG. 10 is a perspective view showing another example of the micro-structure concerned with the present invention.

Further, in the above embodiment, although the IC substrate 1 has been adopted as the micro structure, it is not one limited to the IC substrate 1. For example, as shown in FIG. 10, it may be a three-dimensional structure (micro structure) 40 having been made by an MEMS, or may be a bio-array such as μ-TAS, and the like.

Further, in the above embodiment, although the range of the reference scale 6 has been made 3 μm, without being limited to this, it may be set to an arbitrary range. For example, as shown in FIG. 10, it may be made 20 μm. Incidentally, in FIG. 10, there is collectively shown also an example in which the above-mentioned FIB has been irradiated to a structural member. By this method, it is possible to form the reference scale 6 also with respect to a structure face or side face in one part not parallel to the substrate surface.

Further, when forming the reference scale 6, in the vicinity of the reference scale 6 there may be formed a scale mark, various signs, a recognition mark, a bar code, and the like. By this process, when reworking and re-observing, it is possible to increase a consistency of the scale or the like, and it is possible to improve the convenience of using the scale. Further, on this occasion, a working size (size, kind, depth or the like of a font) may be optimized in compliance with the measurement object article which is desired to be measured.

Further, in the above explanations, although the invention has been explained by using the focused ion beam as the irradiation beam, alternatively it is also possible to use an electron beam as a charged particle beam. In this case, when etching-working, it becomes a gas assist etching.

What is claimed is:

1. A method comprising the steps of:
providing a micro-structure comprised of a substrate having a surface on which a measurement object article is formed and having a reference scale formed on the surface in the vicinity of a region thereof where the measurement object article is formed, the reference scale having a plurality of adjacent graduations spaced-apart a preselected distance from one another; and
measuring a length of the measurement object article using the reference scale by comparing the measurement object article with the plurality of graduations in the reference scale;
wherein the measuring step further comprises the step of measuring the length of the measurement object article along a preselected direction; and
wherein the providing step comprises providing the micro-structure so that the substrate is slanted relative to the preselected direction.

2. A method comprising the steps of:
providing a micro-structure comprised of a substrate having a surface on which a measurement object article is formed and having a reference scale formed on the surface in the vicinity of a region thereof where the measurement object article is formed, the reference scale having a plurality of adjacent graduations spaced-apart a preselected distance from one another; and
measuring a length of the measurement object article using the reference scale by comparing the measurement object article with the plurality of graduations in the reference scale;
wherein the reference scale is formed by a focused ion beam (FIB) of a combined system of an FIB and a scanning electron microscope (SEM);
wherein the measuring step comprises measuring the length of the measurement object article by irradiating an electron beam from the SEM; and
wherein the providing step comprises providing the micro-structure so that the substrate is slanted relative to an irradiation direction of the electron beam irradiated from the SEM.

3. A method comprising the steps of:
providing a micro-structure having a surface, a measurement object article formed on the surface, and a reference scale formed on the surface in the vicinity of the measurement object article, the reference scale containing a plurality of adjacent graduations spaced-apart a preselected distance from one another; and
measuring a length of the measurement object article using the reference scale by comparing the measurement object article with the plurality of graduations in the reference scale while the micro-structure is slanted relative to a length direction of the measurement object article.

4. A method according to claim 3; wherein the measurement object article comprises a wiring pattern.

5. A method according to claim 4; wherein the wiring pattern comprises an etched surface portion of the micro-structure.

6. A method according to claim 4; wherein the wiring pattern comprises a deposition film deposited on the surface of the micro-structure.

7. A method according to claim 3; wherein the measurement object article comprises an etched surface portion of the micro-structure.

8. A method according to claim 3; wherein the measurement object article comprises a deposition film deposited on the surface of the micro-structure.

9. A method according to claim 3; further comprising, prior to the measurement step, the step of displaying onto an image plane of a display the measurement object article and the reference scale formed on the surface of the micro-structure; and wherein the measurement step comprises measuring the length of the displayed measurement object article using the displayed reference scale.

10. A method comprising the steps of:
providing a micro-structure having a surface, a measurement object article formed on the surface, and a reference scale formed on the surface by a focused ion beam (FIB) of a combined system of an FIB and a scanning electron microscope (SEM) and in the vicinity of the measurement object article, the reference scale containing a plurality of adjacent graduations spaced-apart a preselected distance from one another; and
measuring a length of the measurement object article using the reference scale by irradiating an electron beam from the SEM and comparing the measurement object article with the plurality of graduations in the reference scale while the micro-structure is slanted relative to an irradiation direction of the electron beam.

11. A method according to claim 10; wherein the measurement object article comprises a wiring pattern.

12. A method according to claim 10; wherein the measurement object article comprises an etched surface portion of the micro-structure.

13. A method according to claim 10; wherein the measurement object article comprises a deposition film deposited on the surface of the micro-structure.

14. A method according to claim 10; further comprising, prior to the measurement step, the step of displaying onto an image plane of a display the measurement object article and the reference scale formed on the surface of the micro-structure; and wherein the measurement step comprises measuring the length of the displayed measurement object article using the displayed reference scale.

* * * * *

UNITED STATES PATENT AND TRADEMARK OFFICE
CERTIFICATE OF CORRECTION

PATENT NO. : 7,923,267 B2
APPLICATION NO. : 11/346826
DATED : April 12, 2011
INVENTOR(S) : Masanao Munekane et al.

It is certified that error appears in the above-identified patent and that said Letters Patent is hereby corrected as shown below:

Title Page IN THE HEADING, ITEM (73) Assignee,
        "SII Nanotechnology Inc." should read --SII NanoTechnology Inc.--

Signed and Sealed this
Sixteenth Day of August, 2011

David J. Kappos
*Director of the United States Patent and Trademark Office*